(12) United States Patent
Fudeta et al.

(10) Patent No.: US 8,742,440 B2
(45) Date of Patent: Jun. 3, 2014

(54) NITRIDE SEMICONDUCTOR LIGHT-EMITTING ELEMENT AND METHOD FOR PRODUCING SAME

(75) Inventors: Mayuko Fudeta, Osaka (JP); Eiji Yamada, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 101 days.

(21) Appl. No.: 13/579,174

(22) PCT Filed: Feb. 17, 2011

(86) PCT No.: PCT/JP2011/053358
§ 371 (c)(1),
(2), (4) Date: Aug. 15, 2012

(87) PCT Pub. No.: WO2011/102411
PCT Pub. Date: Aug. 25, 2011

(65) Prior Publication Data
US 2012/0319080 A1    Dec. 20, 2012

(30) Foreign Application Priority Data

Feb. 19, 2010 (JP) ................................. 2010-034919

(51) Int. Cl.
*H01L 33/00* (2010.01)
*H01L 33/12* (2010.01)
*H01L 33/20* (2010.01)

(52) U.S. Cl.
CPC ............... *H01L 33/12* (2013.01); *H01L 33/007* (2013.01); *H01L 33/20* (2013.01)
USPC ............. 257/97; 257/94; 257/96; 257/E33.01

(58) Field of Classification Search
CPC ....... H01L 33/30; H01L 33/305; H01L 33/14; H01L 33/145; H01L 33/32; H01L 33/325

USPC ........... 257/79, 80, 81, 82, 83, 84, 85, 86, 87, 257/88, 89, 90, 91, 92, 93, 94, 95, 96, 97, 257/98, 99, 100, 101, 102, 103
See application file for complete search history.

(56) References Cited

U.S. PATENT DOCUMENTS 6,838,705 B1    1/2005  Tanizawa
7,160,748 B2 *  1/2007  Ishibashi et al. ............... 438/45
(Continued)

FOREIGN PATENT DOCUMENTS

JP    7-283140    10/1995
JP    8-148718    6/1996
(Continued)

OTHER PUBLICATIONS

International Search Report mailed Apr. 5, 2011, directed to International Application No. PCT/JP2011/053358; 4 pages.

*Primary Examiner* — Matthew W Such
*Assistant Examiner* — Samuel Lair
(74) *Attorney, Agent, or Firm* — Morrison & Foerster LLP

(57) ABSTRACT

Disclosed is a nitride semiconductor light-emitting element comprising a p-type nitride semiconductor layer 1, a p-type nitride semiconductor layer 2, and a p-type nitride semiconductor layer 3 placed in order above a nitride semiconductor active layer, wherein the p-type nitride semiconductor layer 1 and p-type nitride semiconductor layer 2 each contain Al, the average Al composition of the p-type nitride semiconductor layer 1 is equivalent to the average Al composition of the p-type nitride semiconductor layer 2, the p-type nitride semiconductor layer 3 has a smaller band gap than the p-type nitride semiconductor layer 2, the p-type impurity concentration of the p-type nitride semiconductor layer 2 and the p-type impurity concentration of the p-type nitride semiconductor layer 3 are both lower than the p-type impurity concentration of the p-type nitride semiconductor layer 1, and a method for producing same.

9 Claims, 4 Drawing Sheets

(56) References Cited

U.S. PATENT DOCUMENTS

| | | | |
|---|---|---|---|
| 8,084,763 B2 * | 12/2011 | Chung et al. | 257/13 |
| 8,222,650 B2 * | 7/2012 | Schowalter et al. | 257/79 |
| 2002/0053676 A1 | 5/2002 | Kozaki | |
| 2006/0108603 A1 * | 5/2006 | Uemura et al. | 257/194 |
| 2007/0290230 A1 * | 12/2007 | Kawaguchi et al. | 257/196 |
| 2012/0034718 A1 * | 2/2012 | Khan | 438/27 |
| 2012/0313076 A1 * | 12/2012 | Nakamura et al. | 257/13 |

FOREIGN PATENT DOCUMENTS

| | | |
|---|---|---|
| JP | 2000-164922 | 6/2000 |
| JP | 2001-15809 | 1/2001 |
| JP | 2001-148507 | 5/2001 |
| JP | 2002-84038 | 3/2002 |
| JP | 2005-26414 | 1/2005 |
| JP | 2007-201424 | 8/2007 |
| JP | 2009-130097 | 6/2009 |

* cited by examiner

NITRIDE SEMICONDUCTOR LIGHT-EMITTING ELEMENT AND METHOD FOR PRODUCING SAME

REFERENCE TO RELATED APPLICATIONS

This application is a national stage application under 35 USC 371 of International Application No. PCT/JP2011/053358, filed Feb. 17, 2011, which claims the priority of Japanese Patent Application No. 2010-034919, filed Feb. 19, 2010, the entire contents of which are incorporated herein by reference.

FIELD OF THE INVENTION

The present invention relates to a nitride semiconductor light-emitting element and a method for producing a nitride semiconductor light-emitting element.

BACKGROUND OF THE INVENTION

A nitride semiconductor light-emitting element prepared by employing an AlGaInN-based nitride semiconductor is capable of emitting short-wavelength light such as blue light in high efficiency, and hence a light-emitting device emitting white light can be obtained by combining the same with a fluorescent material. A light-emitting device overstriding luminous efficiency a fluorescent lamp is increasingly obtained as a light-emitting device emitting white light, and hence such a light-emitting device is considered as playing the leading part in future illumination.

As to a light-emitting device emitting white light with such a nitride semiconductor light-emitting element, on the other hand, further improvement of luminous efficiency and resulting development of energy saving are expected.

The principle of light emission in the nitride semiconductor light-emitting element resides in recombination of holes and electrons, and hence it is important to properly prepare a p-type nitride semiconductor layer and an n-type nitride semiconductor layer. In a production process for the nitride semiconductor light-emitting element, however, there are various heat treatment steps disturbing distribution of a p-type impurity such as Mg doped into the p-type nitride semiconductor layer.

First, there is an epitaxial growth step of forming the p-type nitride semiconductor layer itself, which is generally carried out at a high temperature exceeding 1000° C. Second, there is an annealing step for prompting control of the p-type nitride semiconductor layer to the p-type. Third, there is a heat treatment step for improving contactness between an electrode and a nitride semiconductor and the characteristics of the electrode itself after formation of the electrode.

As a result of the heat history in these heat treatment steps, difference arises between the doping quantity of the p-type impurity during epitaxial growth of the p-type nitride semiconductor layer and the doping profile of the p-type nitride semiconductor layer obtained by the doping of the p-type impurity.

Various technical developments for improving the characteristics of a nitride semiconductor light-emitting element by solving such a problem are conducted.

In PTL 1 (Japanese Patent Laying-Open No. 2009-130097), for example, there is disclosed a technique of forming a multilayer structure of an Mg-doped p-type $Al_{0.15}Ga_{0.85}N$ blocking layer and an Mg-doped p-type GaN layer on an active region.

In PTL 2 (Japanese Patent Laying-Open No. 2000-164922), for example, there is disclosed a technique of improving contactness with a positive electrode by increasing an Mg impurity concentration in an outermost portion of a p-type contact layer in contact with the positive electrode.

In PTL 3 (Japanese Patent Laying-Open No. 2001-148507), further, there is disclosed a technique of bringing a p-type nitride semiconductor layer on an active layer into a structure obtained by stacking three layers including a p-type cladding layer doped with a p-type impurity in a middle concentration, a p-type low-concentration doping layer doped with the p-type impurity in a low concentration and a p-type contact layer doped with the p-type impurity in a high concentration in this order.

In Example 7 of PTL 3, there is disclosed a technique of forming a p-type cladding layer made of p-type $Al_{0.16}Ga_{0.85}N$ doped with Mg by $5\times10^{19}$ atoms/cm$^3$ as a p-type layer doped with Mg in a middle concentration, forming a low-concentration doping layer made of undoped GaN as a p-type layer doped with Mg in a low concentration and forming a high-concentration doping layer doped with Mg by $1\times10^{20}$ atoms/cm$^3$ as a p-type layer doped with Mg in a high concentration.

PTL 1: Japanese Patent Laying-Open No. 2009-130097
PTL 2: Japanese Patent Laying-Open No. 2000-164922
PTL 3: Japanese Patent Laying-Open No. 2001-148507

SUMMARY OF THE INVENTION

However, further improvement of the characteristics of a nitride semiconductor light-emitting element is required, due to the recent raising of consciousness about environmental problems.

In consideration of the aforementioned circumstances, an object of the present invention is to provide a nitride semiconductor light-emitting element excellent in characteristics and a method for producing a nitride semiconductor light-emitting element.

The present invention provides a nitride semiconductor light-emitting element including an n-type nitride semiconductor layer, a nitride semiconductor active layer provided on the n-type nitride semiconductor layer and a p-type nitride semiconductor layer provided on the nitride semiconductor active layer, in which the p-type nitride semiconductor layer includes a first p-type nitride semiconductor layer, a second p-type nitride semiconductor layer and a third p-type nitride semiconductor layer in this order from the side of the nitride semiconductor active layer, the first p-type nitride semiconductor layer and the second p-type nitride semiconductor layer contain Al (aluminum) respectively, an average Al composition in the first p-type nitride semiconductor layer and an average Al composition in the second p-type nitride semiconductor layer are equivalent to each other, the third p-type nitride semiconductor layer has a smaller band gap than the second p-type nitride semiconductor layer, and the p-type impurity concentration in the second p-type nitride semiconductor layer and the p-type impurity concentration in the third p-type nitride semiconductor layer are lower than the p-type impurity concentration in the first p-type nitride semiconductor layer respectively.

Preferably in the nitride semiconductor light-emitting element according to the present invention, the p-type nitride semiconductor layer further includes a fourth p-type nitride semiconductor layer on a side of the third p-type nitride semiconductor layer opposite to the side where the nitride semiconductor active layer is set, the fourth p-type nitride semiconductor layer has a smaller band gap than the second p-type nitride semiconductor layer, and the p-type impurity concentration in the fourth p-type nitride semiconductor layer is higher than the p-type impurity concentration in the third p-type nitride semiconductor layer.

Preferably in the nitride semiconductor light-emitting element according to the present invention, the nitride semiconductor active layer has a multiple quantum well structure including a plurality of nitride semiconductor quantum well layers and a plurality of nitride semiconductor barrier layers, and a nitride semiconductor barrier layer, included in the plurality of nitride semiconductor barrier layers, other than a nitride semiconductor barrier layer in contact with the p-type nitride semiconductor layer contains an n-type impurity.

Preferably in the nitride semiconductor light-emitting element according to the present invention, the n-type nitride semiconductor layer includes an n-type nitride semiconductor contact layer and an n-type nitride semiconductor superlattice layer, the n-type nitride semiconductor superlattice layer is positioned between the n-type nitride semiconductor contact layer and the nitride semiconductor active layer, and an average n-type impurity concentration in the n-type nitride semiconductor superlattice layer is at least $1 \times 10^{18}$ atoms/cm$^3$.

The present invention further provides a method for producing a nitride semiconductor light-emitting element, including the steps of vapor-phase-growing a nitride semiconductor active layer on an n-type nitride semiconductor layer, vapor-phase-growing a first p-type nitride semiconductor layer on the nitride semiconductor active layer, vapor-phase-growing a second p-type nitride semiconductor layer having an equivalent average Al composition to the first p-type nitride semiconductor layer on the first p-type nitride semiconductor layer, and vapor-phase-growing a third p-type nitride semiconductor layer having a smaller average Al composition than the first p-type nitride semiconductor layer on the second p-type nitride semiconductor layer, in which the second p-type nitride semiconductor layer and the third p-type nitride semiconductor layer are doped with a p-type impurity in lower concentrations than the first p-type nitride semiconductor layer respectively.

Preferably in the method for producing a nitride semiconductor light-emitting element according to the present invention, the vapor phase growth is interrupted after the step of vapor-phase-growing the second p-type nitride semiconductor layer and before the step of vapor-phase-growing the third p-type nitride semiconductor layer.

Preferably in the method for producing a nitride semiconductor light-emitting element according to the present invention, the pressure of the vapor phase is changed in the interruption of the vapor phase growth.

Preferably, the method for producing a nitride semiconductor light-emitting element according to the present invention further includes a step of vapor-phase-growing a fourth nitride semiconductor layer doped with the p-type impurity in a higher concentration than the third p-type nitride semiconductor layer on the third p-type nitride semiconductor layer after the step of vapor-phase-growing the third p-type nitride semiconductor layer.

Preferably, the nitride semiconductor light-emitting element according to the present invention further includes a nitride semiconductor layer containing Al between the nitride semiconductor active layer and the first p-type nitride semiconductor layer.

According to the present invention, a nitride semiconductor light-emitting element excellent in characteristics and a method for producing a nitride semiconductor light-emitting element can be provided.

DETAILED DESCRIPTION OF THE INVENTION

Figure 1:
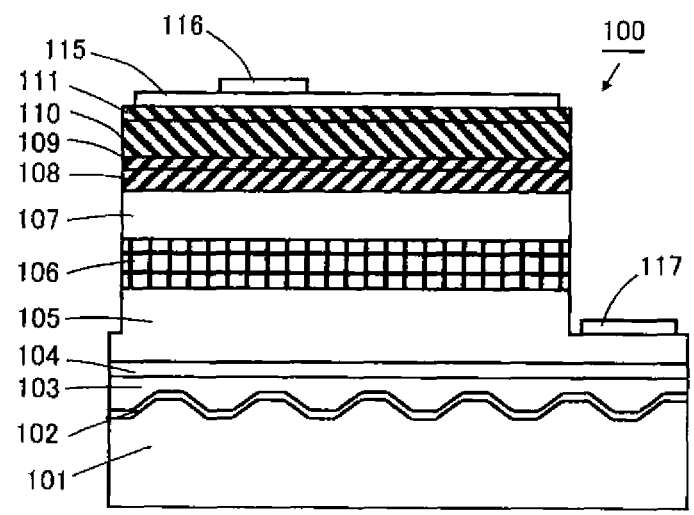
FIG. 1 is a schematic sectional view of a nitride semiconductor light-emitting element according to an embodiment.

An embodiment of the present invention is now described. In the drawings of the present invention, it is assumed that the same reference signs show the same portions or corresponding portions.

FIG. 1 shows a schematic sectional view of a nitride semiconductor light-emitting element according to this embodiment. In a nitride semiconductor light-emitting element 100 according to this embodiment, a nitride semiconductor buffer layer 102 made of AlN, a nitride semiconductor intermediate layer 103 made of undoped GaN and an n-type nitride semiconductor underlayer 104 made of n-type GaN are stacked in this order on a sapphire substrate 101 whose surface is irregularized, as shown in FIG. 1.

In this specification, a laminate of sapphire substrate 101, nitride semiconductor buffer layer 102, nitride semiconductor intermediate layer 103 and n-type nitride semiconductor underlayer 104 is employed as a template substrate. In place of the template substrate, a substrate obtained by forming nitride semiconductor layers on a substrate different from a nitride semiconductor or a substrate made of a nitride semiconductor, for example, can also be employed.

An n-type nitride semiconductor contact layer 105 made of n-type GaN and an n-type nitride semiconductor superlattice layer 106 in which n-type GaN layers and n-type InGaN layers are alternately stacked are stacked in this order on n-type nitride semiconductor underlayer 104 of the template substrate.

N-type nitride semiconductor contact layer 105 is not restricted to the layer made of n-type GaN, but a layer prepared by doping an n-type impurity into a nitride semiconductor layer made of a group III nitride semiconductor expressed in a formula $Al_{x1}Ga_{y1}In_{z1}N$ ($0 \leq x1 \leq 1$, $0 \leq y1 \leq 1$, $0 \leq z1 \leq 1$, and $x1+y1+z1 \neq 0$) or the like can be stacked, for example.

In particular, a nitride semiconductor layer in which silicon is doped into a group III nitride semiconductor expressed in a formula $Al_{x2}Ga_{1-x2}N$ ($0 \leq x2 \leq 1$, preferably $0 \leq x2 \leq 0.5$, and more preferably $0 \leq x2 \leq 0.1$) as an n-type impurity is preferably employed as n-type nitride semiconductor contact layer 105. In this case, there is a tendency that the doping concentration of the n-type impurity can be increased while ensuring excellent crystallinity of n-type nitride semiconductor contact layer 105.

The doping concentration of the n-type impurity in n-type nitride semiconductor contact layer 105 is preferably set to at least $5 \times 10^{17}$ atoms/cm$^3$ and not more than $5 \times 10^{19}$ atoms/cm$^3$.

In a case where the doping concentration of the n-type impurity in n-type nitride semiconductor contact layer 105 is at least $5 \times 10^{17}$ atoms/cm$^3$ and not more than $5 \times 10^{19}$ atoms/cm$^3$, there is a tendency that excellent ohmic contact with an n-side pad electrode 117 described later can be ensured while there is a tendency that occurrence of cracking in n-type nitride semiconductor contact layer 105 can be suppressed, and there is also a tendency that excellent crystallinity of n-type nitride semiconductor contact layer 105 can be ensured.

The total of the thicknesses of nitride semiconductor intermediate layer 103 made of undoped GaN, n-type nitride semiconductor underlayer 104 made of n-type GaN and n-type nitride semiconductor contact layer 105 made of n-type GaN is preferably at least 4 μm and not more than 20 m, more preferably at least 4 μm and not more than 15 μm, and further preferably at least 6 μm and not more than 15 μm, in view of ensuring excellent crystallinity of these layers. In a case where the total of the thicknesses of these layers is less than 4 μm, there is an apprehension that the crystallinity of these layers deteriorates or pits are formed on the surfaces of these layers. In a case where the total of the thicknesses of these layers exceeds 20 μm, there is an apprehension that warpage of sapphire substrate 101 so enlarges that various problems arise in a production process. In a case where the total of the thicknesses of these layers is at least 4 μm and not more than 15 μm, particularly in a case where the same is at least 6 μm and not more than 15 μm, there is a tendency that the crystallinity of these layers can be rendered excellent. In the total of the thicknesses of these layers, the upper limit of the thickness of n-type nitride semiconductor contact layer 105 is not particularly restricted.

While the thickness of n-type nitride semiconductor superlattice layer 106 is not particularly restricted, the same is preferably at least 0.005 μm and not more than 0.5 μm, and more preferably at least 0.01 μm and not more than 0.1 μm. In a case where the thickness of n-type nitride semiconductor superlattice layer 106 is at least 0.005 μm and not more than 0.5 μm, particularly in a case where the same is at least 0.01 μm and not more than 0.1 μm, there are tendencies that n-type nitride semiconductor superlattice layer 106 reduces the number of crystal defects extending from n-type nitride semiconductor contact layer 105 which is the underlayer and that new crystal defects hardly arise in n-type nitride semiconductor superlattice layer 106.

As to a doping profile of the n-type impurity in n-type nitride semiconductor superlattice layer 106, the n-type impurity is doped only into the GaN layers, and a set impurity concentration thereof is preferably at least $5 \times 10^{16}$ atoms/cm$^3$ and not more than $1 \times 10^{20}$ atoms/cm$^3$, in view of ensuring excellent crystallinity and reducing operating voltage for the element. The structure of n-type nitride semiconductor superlattice layer 106 is not restricted to any of the aforementioned structures.

An average n-type impurity concentration in n-type nitride semiconductor superlattice layer 106 is preferably at least $1 \times 10^{18}$ atoms/cm$^3$, more preferably at least $3 \times 10^{18}$ atoms/cm$^3$, and further preferably $5 \times 10^{18}$ atoms/cm$^3$. In a case where the n-type impurity concentration in the layers of n-type nitride semiconductor superlattice layer 106 doped with the n-type impurity is the aforementioned value, a depletion layer of p-n junction hardly spreads, whereby there are tendencies that electrostatic capacity of nitride semiconductor light-emitting element 100 increases, that breakage (electrostatic discharge damage) resulting from electrostatic discharge (Electrostatic Discharge) hardly takes place, and that an electrostatic discharge threshold improves. The average n-type impurity concentration is a value obtained by dividing the total atomic weight of the n-type impurity in n-type nitride semiconductor superlattice layer 106 by the volume of n-type nitride semiconductor superlattice layer 106.

A nitride semiconductor active layer 107, in which n-type nitride semiconductor barrier layers made of n-type GaN and undoped InGaN nitride semiconductor quantum well layers are alternately stacked in this order from the side of n-type nitride semiconductor superlattice layer 106, prepared by stacking a nitride semiconductor barrier layer made of undoped GaN as the uppermost layer is stacked on n-type nitride semiconductor superlattice layer 106. Layers holding the quantum well layers therebetween are formed by the barrier layers, and hence the number of the barrier layers is the number of the quantum well layers+1. Thus, combined positions of holes and electrons can be made to exist in multiple quantum wells (MQW) by doping an n-type impurity into the barrier layers other than the uppermost layer of n-type semiconductor active layer 107 and rendering the uppermost barrier layer undoped, whereby carrier injection efficiency increases, and a nitride semiconductor light-emitting element having such high luminous efficiency that electrons do not overflow also in a case of injecting current of particularly high current density.

A substance having an MQW structure prepared by employing nitride semiconductor layers made of a group III nitride semiconductor expressed in a formula $Ga_{1-z4}In_{z4}N$ (0<z4<0.4) as quantum well layers, employing nitride semiconductor layers made of a nitride semiconductor expressed in a formula $Al_{x3}Ga_{y3}In_{z3}N$ (0≤x3≤1, 0≤y3≤1, 0≤z3≤1, and x3+y3+z3≠0) having a larger band gap than these quantum well layers as barrier layers and alternately stacking the quantum well layers and the barrier layers one by one, for example, can be employed as nitride semiconductor active layer 107, in place of the above.

In a case where nitride semiconductor active layer 107 consists of a multiple quantum well (MQW) structure having nitride semiconductor layers made of the group III nitride semiconductor expressed in the formula $Ga_{1-z4}In_{z4}N$ (0<z4<0.4) as quantum well layers, for example, the In composition in nitride semiconductor active layer 107 and the thickness thereof can be controlled to obtain a desired emission wavelength.

A first p-type nitride semiconductor layer 108 made of p-type AlGaN, a second p-type nitride semiconductor 109 made of undoped AlGaN, a third p-type nitride semiconductor layer 110 made of undoped GaN and a fourth p-type nitride semiconductor layer 111 made of p$^+$ GaN doped with a p-type impurity in a high concentration are stacked in this order on nitride semiconductor active layer 107.

As first p-type nitride semiconductor layer 108, a layer prepared by doping a p-type impurity such as Mg, for example, into a nitride semiconductor layer made of an Al-containing group III nitride semiconductor expressed in a formula $Al_{x5}Ga_{y5}In_{z5}N$ (0<x5≤1, 0≤y5≤1, and 0≤z5≤1), for example, in place of p-type AlGaN can be stacked.

As second p-type nitride semiconductor layer 109, a layer prepared by doping a p-type impurity such as Mg, for example, into a nitride semiconductor layer made of an Al-containing group III nitride semiconductor expressed in a formula $Al_{x6}Ga_{y6}In_{z6}N$ (0<x6≤1, 0≤y6≤1, and 0≤z6≤1), for example, in place of undoped AlGaN can be stacked.

The band gaps of the respective ones of first p-type nitride semiconductor layer 108 and second p-type nitride semiconductor layer 109 are preferably rendered larger than the band gap of nitride semiconductor active layer 107, in order to suppress overflowing of electrons. Therefore, nitride semiconductor layers containing Al can be employed for first p-type nitride semiconductor layer 108 and second p-type nitride semiconductor layer 109 respectively.

The average Al composition (x5) in first p-type nitride semiconductor layer 108 and the average Al composition (x6) in second p-type nitride semiconductor layer 109 are equivalent to each other. The average Al composition (x5) in first p-type nitride semiconductor layer 108 and the average Al composition (x6) in second p-type nitride semiconductor layer 109 are so rendered equivalent to each other that dispersion in incorporability of the p-type impurity such as Mg can be suppressed, whereby dispersion in in-plane distribution of the p-type impurity or between wafers can be suppressed.

While the average Al composition (x5) in first p-type nitride semiconductor layer 108 and the average Al composition (x6) in second p-type nitride semiconductor layer 109 reach the Al compositions x5 and x6 respectively in a case where the Al compositions in the respective layers are uniform, the average compositions $Al_{x5}Ga_{y5}In_{z5}N$ ($0<x5\leq1$, $0\leq y5\leq1$, and $0\leq z5\leq1$) and $Al_{x6}Ga_{y6}In_{z6}N$ ($0<x6\leq1$, $0\leq y6\leq1$, and $0\leq z6\leq1$) can be obtained by obtaining the ratios of the total atomic weight of Al, the total atomic weight of Ga, the total atomic weight of In and the total atomic weight of N with respect to the volumes of the respective layers and dividing these by the ratio of the total atomic weight of N respectively in a case where the same are nonuniform along the layer thickness direction.

In order that the average Al composition (x5) in first p-type nitride semiconductor layer 108 and the average Al composition (x6) in second p-type nitride semiconductor layer 109 are equivalent to each other, the absolute value of the difference between the average Al composition (x5) in first p-type nitride semiconductor layer 108 and the average Al composition (x6) in second p-type nitride semiconductor layer 109 may simply be not more than 0.02.

The p-type impurity concentration in second p-type nitride semiconductor layer 109 is lower than the p-type impurity concentration in first p-type nitride semiconductor layer 108. In a case where the p-type impurity concentration in first p-type nitride semiconductor layer 108 on the side close to nitride semiconductor active layer 107 is low as compared with the p-type impurity concentration in second p-type nitride semiconductor layer 109, barriers of holes in nitride semiconductor active layer 107 so heighten that the hole injection efficiency deteriorates and the luminous efficiency of the element lowers.

In a case where the p-type impurity concentration in first p-type nitride semiconductor layer 108 on the side close to nitride semiconductor active layer 107 is low and the p-type impurity concentration in second p-type nitride semiconductor layer 109 is high, a depletion layer spreads up to second p-type nitride semiconductor layer 109 in a case where high reverse voltage of static electricity or the like is applied. At this time, electrostatic discharge damage takes place in a case where a portion having a low electrostatic discharge threshold is present even in one spot of the spreading depletion layer, and hence nitride semiconductor light-emitting element 100 enters a structure having a weak electrostatic discharge threshold.

In a case where the p-type impurity concentration in first p-type nitride semiconductor layer 108 is high and the n-type impurity concentration in n-type nitride semiconductor superlattice layer 106 is high, on the other hand, a depletion layer hardly spreads outside first p-type nitride semiconductor layer 108 and n-type nitride semiconductor superlattice layer 106, and hence the electrostatic discharge threshold heightens.

In a case of rendering the p-type impurity concentration in second p-type nitride semiconductor layer 109 identical to the p-type impurity concentration in first p-type nitride semiconductor layer 108 or in excess thereof, the p-type impurity such as Mg so deposits in the subsequent stacking of third p-type nitride semiconductor layer 110 that a layer whose p-type impurity concentration locally heightens is formed between second p-type nitride semiconductor layer 109 and third p-type nitride semiconductor layer 110. Such a layer lowers the hole injection efficiency into nitride semiconductor active layer 107 and lowers the luminous efficiency of the element, and hence the p-type impurity concentration in second p-type nitride semiconductor layer 109 is rendered lower than the p-type impurity concentration in first p-type nitride semiconductor layer 108.

The p-type impurity concentrations (atomic concentrations) in the layers can be obtained by SIMS (Secondary Ion Mass Spectrometry).

First p-type nitride semiconductor layer 108 and second p-type nitride semiconductor layer 109 may have superlattice structures obtained by alternately stacking AlGaN layers and GaN layers (may be InGaN layers), for example, respectively. In a case where first p-type nitride semiconductor layer 108 and/or second p-type nitride semiconductor layer 109 has a superlattice structure, it is assumed that the average Al composition is the average composition of Al in the superlattice structure.

While the total of the thicknesses of first p-type nitride semiconductor layer 108 and second p-type nitride semiconductor layer 109 is not particularly restricted, the same is preferably at least 0.005 μm and not more than 0.4 μm, and more preferably at least 0.001 μm and not more than 0.1 μm. In a case where the total of the thicknesses of these layers is at least 0.005 μm and not more than 0.4 μm, particularly in a case where the same is at least 0.001 μm and not more than 0.1 μm, there is a tendency that diffusion of the p-type impurity into nitride semiconductor active layer 107 which is a low temperature growth layer or alteration resulting from a heat history can be suppressed by minimizing growth times of the p-type nitride semiconductor layers which are high temperature growth layers while maintaining functions as the p-type nitride semiconductor layers.

As third p-type nitride semiconductor layer 110, a layer prepared by doping a p-type impurity such as Mg, for example, into a nitride semiconductor layer made of a group III nitride semiconductor expressed in a formula $Al_{x7}Ga_{y7}In_{z7}N$ ($0\leq x7\leq1$, $0\leq y7\leq1$, $0\leq z7\leq1$, and $x7+y7+z7\neq0$), for example, in place of undoped GaN can be stacked.

The average Al composition in third p-type nitride semiconductor layer 110 is preferably smaller than the average Al composition in the first p-type nitride semiconductor layer. In a case where the average Al composition in third p-type nitride semiconductor layer 110 is smaller than the average Al composition in the first p-type nitride semiconductor layer, the average Al composition is so small that characteristics as the p-type nitride semiconductor layer improve. Al may not be contained in third p-type nitride semiconductor layer 110.

The band gap of third p-type nitride semiconductor layer 110 is rendered smaller than the band gap of second p-type nitride semiconductor layer 109. While the function as the p-type nitride semiconductor layer is important for third p-type nitride semiconductor layer 110 and hence largeness of the band gap is not particularly required thereto, the band gap of second p-type nitride semiconductor layer 109 must be enlarged in order to prevent overflowing of electrons from nitride semiconductor active layer 107 to the p-side.

The p-type impurity concentration in third p-type nitride semiconductor layer 110 is rendered lower than the p-type impurity concentration in first p-type nitride semiconductor layer 108. In the case where the p-type impurity concentration in third p-type nitride semiconductor layer 110 is lower than the p-type impurity concentration in first p-type nitride semiconductor layer 108, there are such tendencies that a portion whose p-type impurity concentration heightens is hardly formed between second p-type nitride semiconductor layer 109 and third p-type nitride semiconductor layer 110 and that diffusion of the p-type impurity into nitride semiconductor active layer 107 hardly takes place.

As fourth p-type nitride semiconductor layer 111, a layer prepared by doping a p-type impurity such as Mg, for example, into a nitride semiconductor layer made of a group III nitride semiconductor expressed in a formula $Al_{x8}Ga_{y8}In_{z8}N$ ($0 \leq x8 \leq 1$, $0 \leq y8 \leq 1$, $0 \leq z8 \leq 1$, and $x8+y8+z8 \neq 0$), for example, in place of $p^+$ GaN can be stacked.

The band gap of fourth p-type nitride semiconductor layer 111 is preferably smaller than the band gap of second p-type nitride semiconductor layer 109. This is because the function as the p-type nitride semiconductor layer is important for fourth p-type nitride semiconductor layer 111 and hence largeness of the band gap is not particularly required thereto, while the band gap of first p-type nitride semiconductor layer 108 must preferably be enlarged in order to prevent overflowing of electrons from nitride semiconductor active layer 107 to the p-side.

The p-type impurity concentration in fourth p-type nitride semiconductor layer 111 is preferably higher than the p-type impurity concentration in third p-type nitride semiconductor layer 110. In a case where the p-type impurity concentration in fourth p-type nitride semiconductor layer 111 is higher than the p-type impurity concentration in third p-type nitride semiconductor layer 110, there is a tendency that the total quantity of the diffusing p-type impurity can be suppressed while keeping contact resistance between fourth p-type nitride semiconductor layer 111 and a transparent electrode 115 described later sufficiently low.

While the thickness of fourth p-type nitride semiconductor layer 111 is not particularly restricted, the same is preferably at least 0.01 μm and not more than 0.5 μm, and more preferably at least 0.05 μm and not more than 0.2 μm. In a case where the thickness of fourth p-type nitride semiconductor layer 111 is at least 0.01 μm and not more than 0.5 μm, particularly in a case where the same is at least 0.05 μm and not more than 0.2 μm, there is a tendency that an emission output of the nitride semiconductor light-emitting element improves.

Transparent electrode 115 is formed on part of the surface of fourth p-type nitride semiconductor layer 111. A p-side pad electrode 116 is formed on part of the surface of transparent electrode 115 to be electrically connected thereto, and an n-side pad electrode 117 is formed on part of the surface of n-type nitride semiconductor contact layer 105 to be electrically connected thereto.

Figure 2:
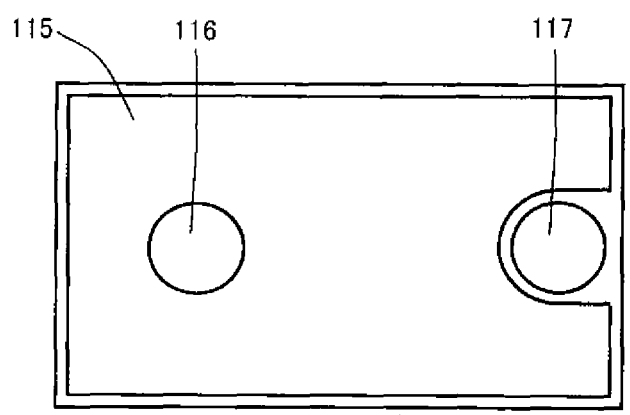
FIG. 2 is a schematic top plan view of the nitride semiconductor light-emitting element according to the embodiment.

FIG. 2 shows a schematic top plan view of the nitride semiconductor light emitting element according to this embodiment. As shown in FIG. 2, p-side pad electrode 116 is formed within the surface of transparent electrode 116.

As the material for transparent electrode 115, ITO (Indium Tin Oxide), tin oxide, indium oxide, zinc oxide, gallium oxide, IZO (Indium Zinc Oxide), AZO (Aluminum Zinc Oxide) or GZO (gallium Zinc Oxide), for example, can be employed.

The thickness of transparent electrode 115 is preferably set to at least 10 nm and not more than 1000 nm, and more preferably set to at least 50 nm and not more than 500 nm. In a case where the thickness of transparent electrode 115 is at least 10 nm and not more than 1000 nm, particularly in a case where the same is at least 50 nm and not more than 500 nm, there are tendencies that balance between an effect of prompting diffusion of current by reducing specific resistance of transparent electrode 115 and an effect of improving light extraction efficiency by ensuring light transmittance of transparent electrode 115 is excellent and that the light output can be maximized.

As p-side pad electrode 116 and n-side pad electrode 117, laminates of Ni layers and Au layers, laminates of Ti layers and Al layers, laminates of Ti—Al alloy layers, Hf layers and Al layers or Hf—Al alloy layers can be employed, for example.

As p-side pad electrode 116 and n-side pad electrode 117, transparent conductive films of ITO or the like may also be employed, and a flip chip type light-emitting element can be obtained by employing metals of high reflectance.

An example of a method for producing the nitride semiconductor light-emitting element according to this embodiment is now described. First, the template substrate is formed by vapor-phase-growing nitride semiconductor buffer layer 102 made of AlN, for example, nitride semiconductor intermediate layer 103 made of undoped GaN, for example, and n-type nitride semiconductor underlayer 104 made of n-type GaN, for example, on sapphire substrate 101 in this order by MOCVD (Metal Organic Chemical Vapor Deposition), for example.

Then, n-type nitride semiconductor contact layer 105 made of n-type GaN, for example, and n-type nitride semiconductor superlattice layer 106 in which n-type GaN layers and undoped InGaN layers are alternately stacked, for example, are vapor-phase-grown on n-type nitride semiconductor underlayer 104 of the template substrate in this order by MOCVD, for example.

Then, nitride semiconductor active layer 107, in which n-type nitride semiconductor barrier layers made of n-type GaN and undoped InGaN nitride semiconductor quantum well layers are alternately stacked in this order from the side of n-type nitride semiconductor superlattice layer 106, prepared by stacking a nitride semiconductor barrier layer made of undoped GaN as the uppermost layer, for example, is vapor-phase-grown on n-type nitride semiconductor superlattice layer 106 by MOCVD, for example.

In the case where nitride semiconductor active layer 107 consists of the multiple quantum well (MQW) structure having the nitride semiconductor layers made of the group III nitride semiconductor expressed in the formula $Ga_{1-z4}In_{z4}N$ ($0<z4<0.4$) as the quantum well layers, for example, there is an apprehension that crystallinity deteriorates if the temperature of the template substrate at the time of the vapor phase growth of nitride semiconductor active layer 107 is low, while there is an apprehension that sublimation of InN is so remarkable that incorporation efficiency of In into a solid phase lowers and the In composition fluctuates if the temperature of the template substrate at the time of the vapor phase growth of nitride semiconductor active layer 107 is high. In the case where nitride semiconductor active layer 107 consists of the multiple quantum well (MQW) structure having the nitride semiconductor layers made of the group III nitride semiconductor expressed in the formula $Ga_{1-z4}In_{z4}N$ ($0<z4<0.4$) as the quantum well layers, for example, therefore, the temperature of the template substrate in the formation of nitride semiconductor active layer 107 is preferably at least 700° C. and not more than 900° C.

Then, Al-containing first p-type nitride semiconductor layer 108 of p-type AlGaN or the like, for example, is vapor-phase-grown on nitride semiconductor active layer 107 by MOCVD, for example. In a case where first p-type nitride semiconductor layer 108 is made of p-type AlGaN, a uniform film of high quality can be obtained by growing first p-type nitride semiconductor layer 108 with high pressure while growing the same without fluctuating the quantity of group III source gas and the quantity of group V source gas.

Then, Al-containing second p-type nitride semiconductor layer 109 of undoped AlGaN, for example, is vapor-phase-grown on first p-type nitride semiconductor layer 108 by MOCVD, for example. In this specification, undoped denotes that no impurity is intentionally introduced in vapor phase growth, and an impurity may be contained even in an undoped layer due to a reason such as diffusion. In a case where second p-type nitride semiconductor layer 109 is made of p-type AlGaN, a uniform film of high quality can be obtained by growing second p-type nitride semiconductor layer 109 with low pressure while growing the same without fluctuating the quantity of group III source gas and the quantity of group V source gas.

As hereinabove described, second p-type nitride semiconductor layer 109 is so formed that the average Al composition is lower than that in first p-type nitride semiconductor layer 108, and formed by doping the p-type impurity thereinto so that the p-type impurity concentration is lower than that in first p-type nitride semiconductor layer 108.

Then, second p-type nitride semiconductor layer 109 consisting of third p-type nitride semiconductor layer 110 made of undoped GaN, for example, is vapor-phase-grown on second p-type nitride semiconductor layer 109 by MOCVD, for example. Third p-type nitride semiconductor layer 110 is preferably so formed that the average Al composition is lower than that in first p-type nitride semiconductor layer 108. Further, third p-type nitride semiconductor layer 110 is preferably formed by doping the p-type impurity thereinto so that the p-type impurity concentration is lower than that in first p-type nitride semiconductor layer 108.

The vapor phase growth is preferably interrupted after vapor-phase-growing second p-type nitride semiconductor layer 109 and before vapor-phase-growing third p-type nitride semiconductor layer 110. In this case, there is a tendency that the pressure can be changed to pressure of the vapor phase suitable to the growth rate of third p-type nitride semiconductor layer 110 during the interruption of the vapor phase growth.

Then, fourth p-type nitride semiconductor layer 111 made of p$^+$ GaN, for example, is vapor-phase-grown on third p-type nitride semiconductor layer 110 by MOCVD, for example. Fourth p-type nitride semiconductor layer 111 is preferably formed by doping the p-type impurity thereinto so that the p-type impurity concentration is higher than that in third p-type nitride semiconductor layer 110.

Then, transparent electrode 115 made of ITO, for example, is formed on part of the surface of fourth p-type nitride semiconductor layer 111 by sputtering or vacuum evaporation, for example.

Then, part of the surface of n-type nitride semiconductor contact layer 105 is exposed by removing part of a wafer after the formation of transparent electrode 115 by etching.

Then, p-side pad electrode 116 is formed on part of the surface of transparent electrode 115, while n-side pad electrode 117 is formed on part of the surface of n-type nitride semiconductor contact layer 105. Thereafter the nitride semiconductor light-emitting element (nitride semiconductor light-emitting diode element) according to this embodiment is obtained by dividing the wafer into individual elements by scribing or the like.

In the nitride semiconductor light-emitting element according to this embodiment, it is possible to compatibly attain such generally conflictive structures that the p-type impurity can be inhibited from diffusing into nitride semiconductor active layer 107 and p-type nitride semiconductor layers of high p-type impurity concentrations can be set in the vicinity of nitride semiconductor active layer 107 also after through heat treatment steps in the production process for the nitride semiconductor light-emitting element. Thus, a nitride semiconductor light-emitting element of high luminous efficiency can be implemented.

As a nitride semiconductor light-emitting diode element according to Example 1, an AlN buffer layer 102, an undoped GaN layer 103, an n-type GaN underlayer 104 (n-type impurity (Si) concentration: $6 \times 10^{18}$ atoms/cm$^3$), an n-type GaN contact layer 105 (n-type impurity (Si) concentration: $6 \times 10^{18}$ atoms/cm$^3$, thickness: 1.5 µm), an n-type superlattice layer 106 formed by alternately stacking Si-doped n-type GaN layers (n-type impurity (Si) concentration: $5 \times 10^{18}$ atoms/cm$^3$, thickness: 1.75 nm) and Si-doped InGaN layers (n-type impurity (Si) concentration: $5 \times 10^{18}$ atoms/cm$^3$, thickness: 1.75 nm) by 20 cycles, a nitride semiconductor active layer 107 formed by stacking an undoped GaN barrier layer after alternately stacking Si-doped n-type GaN barrier layers (n-type impurity (Si) concentration: $4 \times 10^{17}$ atoms/cm$^3$, thickness: 6.5 nm) and undoped InGaN quantum well layers (thickness: 3.5 nm) by six cycles, a first p-type nitride semiconductor layer 108 (p-type impurity (Mg) concentration: $2 \times 10^{19}$ atoms/cm$^3$, thickness: 11.75 nm) made of Mg-doped p-type AlGaN, a second p-type nitride semiconductor layer 109 (p-type impurity (Mg) concentration: $1 \times 10^{19}$ atoms/cm$^3$, thickness: 3.75 nm) made of undoped AlGaN, a third p-type nitride semiconductor layer 110 (p-type impurity (Mg) concentration: $1 \times 10^{19}$ atoms/cm$^3$, thickness: 60 nm) made of undoped GaN and a fourth p-type nitride semiconductor layer 111 (p-type impurity (Mg) concentration: $3 \times 10^{19}$ atoms/cm$^3$, thickness: 20 nm) made of p$^+$ GaN are stacked in this order on a sapphire substrate 101 whose surface is irregularized, as shown in FIGS. 1 and 2.

A transparent electrode 115 made of ITO is formed on part of the surface of fourth p-type nitride semiconductor layer 107, a p-side pad electrode 116 consisting of a laminate of an Ni layer and an Au layer from the side close to transparent electrode 115 is formed on part of the surface of transparent electrode 115, and an n-side pad electrode 117 consisting of a laminate of an Ni layer and an Au layer is formed on part of the surface of n-type GaN contact layer 105.

The nitride semiconductor light-emitting diode element according to Example 1 having the aforementioned structure was prepared as follows:

First, a template substrate was prepared by forming AlN buffer layer 102 on sapphire substrate 101 whose surface was irregularized by sputtering or MOCVD, and stacking undoped GaN layer 103 and Si-doped n-type GaN underlayer 104 (n-type impurity (Si) concentration: $6 \times 10^{18}$ atoms/cm$^3$) in this order on AlN buffer layer 102. The Si doping concentration in n-type GaN underlayer was set to $6 \times 10^{18}$ atoms/cm$^3$.

Then, the template substrate was set in an MOCVD apparatus which was a vapor phase growth apparatus, and the pressure of a vapor phase in the MOCVD apparatus was controlled to $2 \times 10^2$ Pa. Then, the temperature of the template substrate was raised to 1195° C. while feeding H$_2$ gas as carrier gas and NH$_3$ gas as a group V raw material into the MOCVD apparatus, to vapor-phase-grow n-type GaN contact layer 105 (n-type impurity (Si) concentration: $6\times10^{18}$ atoms/cm$^3$) on n-type GaN underlayer 104 of the template substrate into the thickness of 1.5 μm. SiH$_4$ gas was employed for an Si dopant raw material employed for the vapor phase growth of n-type GaN contact layer 105, and the Si doping concentration was set to $6\times10^{18}$ atoms/cm$^3$.

Then, after the vapor phase growth of n-type GaN contact layer 105, the carrier gas was switched from the H$_2$ gas to N$_2$ gas, and the temperature of the template substrate was lowered to 870° C.

Then, n-type superlattice layer 106 having a total thickness of 70 nm was stacked by alternately stacking 20 pairs of the Si-doped n-type GaN layers of 1.75 nm in thickness and the n-type InGaN layers of 1.75 nm in thickness. SiH$_4$ gas was employed for the Si dopant raw material. N-type superlattice layer 106 is rendered highly doped in this manner so that a depletion layer does not spread up to n-type GaN contact layer 105 below n-type superlattice layer 106 or n-type GaN underlayer 104 of the template substrate even if high reverse voltage of static electricity or the like is applied, whereby an electrostatic discharge threshold heightens. This is because, while a crystal deteriorates in crystal quality as approaching the substrate and there exists a portion weak against electrostatic electricity or the like, the same is not electrostatically broken if the depletion layer does not spread thereto.

After vapor-phase-growing n-type superlattice layer 106, the temperature of the template substrate was lowered to 850° C. Then, n-type semiconductor active layer 107 having an MQW structure whose total thickness was 66.5 nm was formed by stacking six pairs of Si-doped n-type GaN barrier layers of 6.5 nm in thickness and undoped InGaN quantum well layers of 3.5 nm in thickness, thereafter raising the temperature of the template substrate to 860° C. and stacking an undoped GaN barrier layer of 6.5 nm in thickness. SiH$_4$ gas was employed for the Si dopant raw material employed for the vapor phase growth of the Si-doped n-type GaN barrier layers.

Thus, combined positions of holes and electrons can be set in the MQW of nitride semiconductor active layer 107 by doping Si into the first six layers included in the barrier layers constituting nitride-semiconductor active layer 107 and rendering the last barrier layer undoped, and a nitride semiconductor light-emitting element having high luminous efficiency with no overflowing of electrons also in a case of injecting high current is obtained.

While the temperature of the template substrate is raised in order to grow p-type layers described later after vapor-phase-growing nitride semiconductor active layer 107, the undoped GaN barrier layer forming the uppermost layer of nitride semiconductor active layer 107 is easily damaged. However, the undoped GaN barrier layer forming the uppermost layer is rendered undoped and the undoped GaN barrier layer forming the uppermost layer is vapor-phase-grown after raising the temperature of the template substrate to 860°, whereby crystal quality of the undoped GaN barrier layer forming the uppermost layer improves, and damage resulting from the temperature rise of the temperate substrate can be prevented.

Then, the pressure of the vapor phase in the MOCVD apparatus was lowered to $1\times10^4$ Pa, while the temperature of the template substrate was raised to 1110° C. Dispersion of Al compositions in AlGaN layers described later between wafers and dispersion of Al compositions in the wafers in the MOCVD apparatus capable of growing a large number of wafers can be suppressed and the yield of elements can be improved by lowering the pressure of the vapor phase in the MOCVD apparatus to $1\times10^4$ Pa.

Then, the carrier gas supplied into the MOCVD apparatus was switched from the N$_2$ gas to H$_2$ gas, for vapor-phase-growing first p-type nitride semiconductor layer 108 (p type impurity (Mg) concentration: $2\times10^{19}$ atoms/cm$^3$) made of Mg-doped p-type Al$_{0.17}$Ga$_{0.83}$N having a thickness of 11.25 nm while vapor-phase-growing second p-type nitride semiconductor layer 109 (p-type impurity (Mg) concentration: $1\times10^{19}$ atoms/cm$^3$) consisting of an undoped Al$_{0.17}$Ga$_{0.83}$N layer having the thickness of 3.75 nm.

The average Al composition in first p-type nitride semiconductor layer 108 was set to 17%, while Cp$_2$Mg (biscyclopentadienyl magnesium) gas was employed as an Mg dopant raw material for first p-type nitride semiconductor layer 108 and the Mg doping concentration was set to $2\times10^{19}$ atoms/cm$^3$.

The average Al composition in second p-type nitride semiconductor layer 109 was set to 17%, and no Cp$_2$Mg gas was fed during the vapor phase growth of second p-type nitride semiconductor layer 109. However, Mg was incorporated into actually grown second p-type semiconductor layer 109 made of undoped AlGaN due to diffusion, and the Mg atomic concentration in second p-type nitride semiconductor layer 109 was $1\times10^{19}$ atoms/cm$^3$.

Then, the vapor phase growth was temporarily interrupted and the pressure of the vapor phase in the MOCVD apparatus was raised to $2\times10^4$ Pa. Thereafter vapor phase growth was started, to vapor-phase-grow third p-type nitride semiconductor layer 110 (p-type impurity (Mg) concentration: $1\times10^{19}$ atoms/cm$^3$) made of undoped GaN having the thickness of 60 nm and to vapor-phase-grow fourth p-type nitride semiconductor layer 111 (p-type impurity (Mg) concentration: $3\times10^{19}$ atoms/cm$^3$) made of p$^+$ GaN having a thickness of 30 nm. The reason for returning the pressure of the vapor phase in the MOCVD apparatus to $2\times10^4$ Pa is that the rate of activation of Mg improves and operating voltage for the element can be lowered.

No Cp$_2$Mg gas was fed during the vapor phase growth of third p-type nitride semiconductor layer 110. However, Mg was incorporated into actually grown third p-type nitride semiconductor layer 110 made of undoped GaN due to diffusion, and the Mg atomic concentration in third p-type nitride semiconductor layer 110 was $1\times10^{19}$ atoms/cm$^3$.

The Mg doping concentration in fourth p-type nitride semiconductor layer 111 made of p$^+$ GaN was set to $3\times10^{19}$ atoms/cm$^3$. The Mg doping concentration in fourth p-type nitride semiconductor layer 111 is so set to the highly doped level of $3\times10^{19}$ atoms/cm$^3$ that contact resistance between fourth p-type nitride semiconductor layer 111 and transparent electrode 115 made of ITO described later, whereby driving voltage for the element can be reduced.

Then, annealing at 950° C. was performed in an N$_2$ gas atmosphere, in order to prompt control of first p-type nitride semiconductor layer 108, second p-type nitride semiconductor layer 109, third p-type nitride semiconductor layer 110 and fourth p-type nitride semiconductor layer 111 to the p types.

Then, transparent electrode 115 made of ITO was formed on part of the surface of fourth p-type nitride semiconductor layer 111 by sputtering. Then, annealing at 500° C. was performed on the wafer after the formation of transparent electrode 115 in an atmosphere containing oxygen, in order to improve characteristics of ITO.

Thereafter part of the surface of n-type GaN contact layer 105 was exposed by removing part of the wafer after the formation of transparent electrode 115 by etching. Then, p-side pad electrode 116 and n-side pad electrode 117 consisting of the Ni layers and the Au layers were simultaneously formed on the surface of transparent electrode 115 and on the surface of n-type GaN contact layer 105 respectively by vacuum evaporation.

Thereafter a protective film (not shown) covering the whole other than p-side pad electrode 116 and n-side pad electrode 117 was formed, and heat treatment at 300° C. was performed in the state forming the protective film, in order to reduce contact resistance between p-side pad electrode 116 and transparent electrode 115 and contact resistance between the n-side pad electrode 113 and n-type GaN contact layer 105 respectively. Thereafter the nitride semiconductor light-emitting diode element according to Example 1 was obtained by dividing the wafer into individual elements by scribing and application of bending stress.

As a result of testing 10 samples of the nitride semiconductor light-emitting diode element according to Example 1 obtained in the aforementioned manner in chip states (before packaging by resin sealing), an emission output was 37 mW on the average with operating current of 30 mA. Electrostatic discharge thresholds of the samples of the nitride semiconductor light-emitting diode element according to Example 1 were excellent in all of the 10 samples as a result of testing the same by an HBM (Human Body Model) method with application of 1500 V, and hence the same were at least 1500 V. Therefore, the nitride semiconductor light-emitting diode element according to Example 1 was excellent in both emission characteristics and electrostatic discharge threshold.

Comparative Example

A nitride semiconductor light-emitting diode element according to comparative example was prepared as follows: First, elements up to a nitride semiconductor active layer 107 were prepared similarly to Example 1. Then, carrier gas was switched from $N_2$ gas to $H_2$ gas, for vapor-phase-growing a p-type AlGaN layer on nitride semiconductor active layer 107 into a thickness of 15 nm (growth conditions were identical to those for first p-type nitride semiconductor layer 108).

Then, after raising the pressure of a vapor phase in an MOCVD apparatus up to $2\times10^4$ Pa, a p-type GaN layer was vapor-phase-grown into a thickness of 60 nm (growth conditions were identical to those for third p-type nitride semiconductor layer 110). Then, a $p^+$ GaN layer was vapor-phase-grown into a thickness of 30 nm (growth conditions were identical to those for fourth p-type nitride semiconductor layer 111). Thereafter the nitride semiconductor light-emitting diode element according to comparative example was prepared similarly to Example 1.

In the nitride semiconductor light-emitting diode element according to comparative example obtained in the aforementioned manner, an emission output was 33 mW with operating current of 30 mA, and the emission output was lower by about 10 percent as compared with the nitride semiconductor light-emitting diode element according to Example 1.

Figure 3:
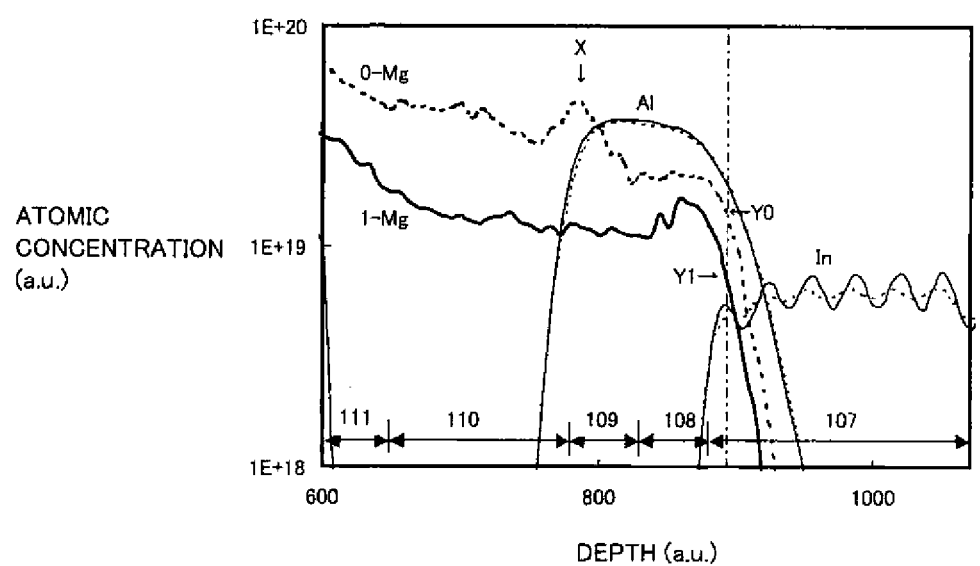
FIG. 3 is a diagram showing atomic concentration profiles of nitride semiconductor light-emitting diode elements according to Example and comparative example.

FIG. 3 shows atomic concentration profiles of the nitride semiconductor light-emitting diode element according to Example 1 and the nitride semiconductor light-emitting diode element according to comparative example by SIMS (Secondary Ion Mass Spectrometry). The axis of abscissas in FIG. 3 shows depths (depth (a.u.)), and the axis of ordinates shows atomic concentrations (concentration (a.u.)). Referring to FIG. 3, 1-Mg denotes the Mg atomic concentration in Example 1, 0-Mg denotes the Mg atomic concentration in comparative example, Al denotes relative Al atomic concentrations (substantially coinciding in Example 1 and comparative example), and In denotes relative In atomic concentrations (substantially coinciding in Example 1 and comparative example).

The first feature in FIG. 3 resides in Mg atomic concentrations in uppermost quantum well layers in nitride semiconductor active layers 107. A vertical line is drawn on a portion corresponding to the uppermost layers of the quantum well layers of six cycles in FIG. 3, and it is assumed that Y0 and Y1 represent the Mg atomic concentration in comparative example and the Mg concentration in Example 1 on the portion respectively. Comparing both of the Mg atomic concentration of Y0 and the Mg atomic concentration of Y1 with each other, it is understood that the nitride semiconductor light-emitting diode element according to Example 1 was capable of reducing the Mg concentration in the uppermost layer of the quantum well layers to about half as compared with the nitride semiconductor light-emitting diode element according to comparative example.

The second feature in FIG. 3 resides in the presence of a point X where the Mg concentration heightens between the p-type AlGaN layer and the p-type GaN layer in the Mg atomic concentration profile of comparative example. The inventors have noted that a portion of a high concentration is present on this interface in comparative example, and found that it is effective to perform vapor phase growth lowering a carrier concentration in the vicinity of this interface, i.e., in second p-type nitride semiconductor layer 109 which is an upper portion of the p-type AlGaN layer and preferably in third p-type nitride semiconductor layer 110 which is a lower portion of the p-type GaN layer. This vapor phase growth method is particularly effective in a case of interrupting the vapor phase growth between the vapor phase growth of second p-type nitride semiconductor layer 109 and the vapor phase growth of third p-type nitride semiconductor layer 110 by changing the pressure of the vapor phase or the like.

A nitride semiconductor light-emitting diode element according to Example 2 was prepared similarly to Example 1 except that a third p-type nitride semiconductor layer 110 was not undoped but doped with Mg and the p-type impurity (Mg) concentration in third p-type nitride semiconductor layer 110 was set to $4\times10^{19}$ atoms/cm$^3$.

In the nitride semiconductor light-emitting diode element according to Example 2 prepared in the aforementioned manner, the p-type impurity (Mg) concentration in a fourth p-type nitride semiconductor layer 111 can be heightened to $5\times10^{19}$ atoms/cm$^3$ even at the same Cp$_2$Mg flow rate as in Example 1.

Thus, contact resistance between fourth p-type nitride semiconductor layer 111 and a transparent electrode 115 was reduced in the nitride semiconductor light-emitting diode element according to Example 2, and it was possible to reduce operating voltage for the element.

A nitride semiconductor light-emitting diode element according to Example 3 was prepared similarly to Example 1 except that TMI (trimethyl indium) was further supplied as gas for vapor phase growth of a third p-type nitride semiconductor layer 110.

While the temperature of a template substrate during the vapor phase growth of third p-type nitride semiconductor layer 110 is at a high level of 1110° C. and hence In is not incorporated into third p-type nitride semiconductor layer 110, the rate of activation of Mg in third p-type nitride semiconductor layer 110 can be raised, and hence it was possible to reduce operating voltage for the element.

Figure 4:
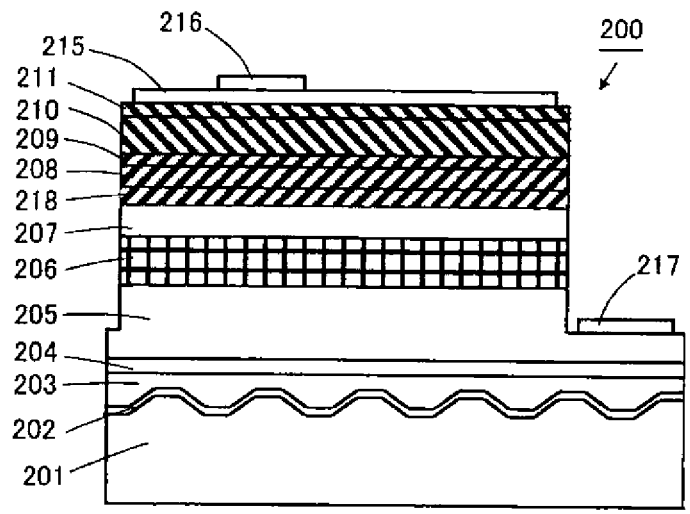
FIG. 4 is a schematic sectional view of a nitride semiconductor light-emitting diode element according to Example 4.
Figure 5:
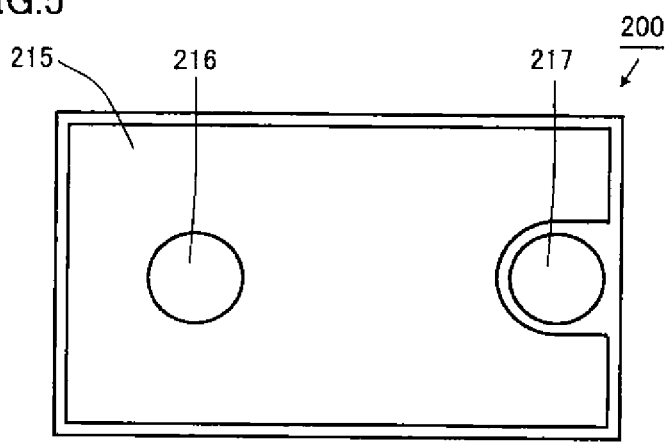
FIG. 5 is a schematic top plan view of the nitride semiconductor light-emitting diode element according to Example 4.

As shown in FIGS. 4 and 5, an AlN buffer layer 202, an undoped GaN layer 203, an n-type GaN underlayer 204 (n-type impurity (Si) concentration: $6\times10^{18}$ atoms/cm$^3$), an n-type GaN contact layer 205 (n-type impurity (Si) concentration: $6 \times 10^{18}$ atoms/cm$^3$, thickness: 1.5 µm), an n-type superlattice layer 206 prepared by alternately stacking. Si-doped n-type GaN layers (n-type impurity (Si) concentration: $5 \times 10^{18}$ atoms/cm$^3$, thickness: 1.75 nm) and Si-doped InGaN layers (n-type impurity (Si) concentration: $5 \times 10^{18}$ atoms/cm$^3$, thickness: 1.75 nm) by 20 cycles, a nitride semiconductor active layer 207 prepared by alternately stacking Si-doped n-type GaN barrier layers (n-type impurity (Si) concentration: $4 \times 10^{17}$ atoms/cm$^3$, thickness: 6.5 nm) and undoped InGaN quantum well layers (thickness: 3.5 nm) by six cycles and thereafter stacking an undoped GaN barrier layer, an undoped AlGaN layer 218 (thickness: 2 nm), a first p-type nitride semiconductor layer 208 (p-type impurity (Mg) concentration: $2 \times 10^{19}$ atoms/cm$^3$, thickness: 1.75 nm) made of Mg-doped p-type AlGaN, a second p-type nitride semiconductor layer 209 (p-type impurity (Mg) concentration: $1 \times 10^{19}$ atoms/cm$^3$, thickness: 3.75 nm) made of undoped AlGaN, a third p-type nitride semiconductor layer 210 (p-type impurity (Mg) concentration: $1 \times 10^{19}$ atoms/cm$^3$, thickness: 60 nm) made of undoped GaN and a fourth p-type nitride semiconductor layer 211 (p-type impurity (Mg) concentration: $3 \times 10^{19}$ atoms/cm$^3$, thickness: 20 nm) made of p$^+$ GaN are stacked in this order on a sapphire substrate 201 whose surface is irregularized, as a nitride semiconductor light-emitting diode element 200 according to Example 4.

A transparent electrode 215 made of ITO is formed on part of the surface of fourth p-type nitride semiconductor layer 211, a p-side pad electrode 216 consisting of a laminate of an Ni layer and an Au layer from the side close to transparent electrode 215 is formed on part of the surface of transparent electrode 215, and an n-side pad electrode 217 consisting of a laminate of an Ni layer and an Au layer is formed on part of the surface of n-type GaN contact layer 205.

The nitride semiconductor light-emitting diode element according to Example 4 having the aforementioned structure was prepared as follows:

First, the elements up to nitride semiconductor active layer 207 were prepared similarly to Example 1.

Then, the pressure of a vapor phase in an MOCVD apparatus was lowered to $1 \times 10^4$ Pa, while the temperature of a template substrate was raised to 1110° C. Dispersion of Al compositions in AlGaN layers described later between wafers and dispersion of Al compositions in the wafers in the MOCVD apparatus capable of growing a large number of wafers can be suppressed and the yield of elements can be improved by lowering the pressure of the vapor phase in the MOCVD apparatus to $1 \times 10^4$ Pa.

Then, carrier gas supplied into the MOCVD apparatus was switched from N$_2$ gas to H$_2$ gas for vapor-phase-growing undoped Al$_{0.17}$Ga$_{0.83}$N layer 218 having the thickness of 2 nm, and first p-type nitride semiconductor layer 208 (p-type impurity (Mg) concentration: $2 \times 10^{19}$ atoms/cm$^3$) made of Mg-doped p-type Al$_{0.17}$Ga$_{0.83}$N having a thickness of 11.25 nm was then vapor-phase-grown, while second p-type nitride semiconductor layer 209 (p-type impurity (Mg) concentration: $1 \times 10^{19}$ atoms/cm$^3$) consisting of an undoped Al$_{0.17}$Ga$_{0.83}$N layer having the thickness of 3.75 nm was vapor-phase-grown.

The average Al composition in undoped Al$_{0.17}$Ga$_{0.83}$N layer 218 was set to 17%, and no impurity source gas was fed.

The average Al composition in first p-type nitride semiconductor layer 208 was set to 17%, while Cp$_2$Mg (biscyclopentadienyl magnesium) gas was employed as an Mg dopant raw material for first p-type nitride semiconductor layer 208 and the Mg doping concentration was set to $2 \times 10^{19}$ atoms/cm$^3$.

The average Al composition in second p-type nitride semiconductor layer 209 was set to 17%, and no Cp$_2$Mg gas was fed during the vapor phase growth of second p-type nitride semiconductor layer 209.

Then, the vapor phase growth was temporarily interrupted and the pressure of the vapor phase in the MOCVD apparatus was raised to $2 \times 10^4$ Pa. Thereafter vapor phase growth was started, to vapor-phase-grow third p-type nitride semiconductor layer 210 (p-type impurity (Mg) concentration: $1 \times 10^{19}$ atoms/cm$^3$) made of undoped GaN having the thickness of 60 nm, and to vapor-phase-grow fourth p-type nitride semiconductor layer 211 (p-type impurity (Mg) concentration: $3 \times 10^{19}$ atoms/cm$^3$) made of p$^+$ GaN having a thickness of 30 nm.

Actual impurity concentrations in the p-type layers grown in this manner are as follows: In actually grown undoped Al$_{0.17}$Ga$_{0.83}$N layer 218, Mg is incorporated due to diffusion. While this is because Mg diffuses from first p-type nitride semiconductor layer 208, this Mg diffusion takes place during the growth of first p-type nitride semiconductor layer 208, and subsequent second p-type nitride semiconductor layer 209 is so grown that the diffusion from first p-type nitride semiconductor layer 208 into undoped Al$_{0.17}$Ga$_{0.83}$N layer 218 stops, and the Mg diffusion is prevented by second p-type nitride semiconductor layer 209 grown without feeding impurity source gas in practice during the subsequent growth of third p-type nitride semiconductor layer 210 and fourth p-type nitride semiconductor layer 211. While the thickness of undoped Al$_{0.17}$Ga$_{0.83}$N layer 218 is small and it is difficult to detect the Mg concentration in this layer, the Mg concentration steeply changes in this undoped Al$_{0.17}$Ga$_{0.83}$N layer 218, the Mg concentration in the well layer forming the uppermost layer of nitride-semiconductor active layer 207 reaches $2 \times 10^{18}$ atoms/cm$^3$ due to the presence of undoped Al$_{0.17}$Ga$_{0.83}$N layer 218, and it follows that the Mg diffusion into the active layer has been further suppressed than the case of Example 1.

Undoped Al$_{0.17}$Ga$_{0.83}$N layer 218 plays the role of Mg diffusion prevention, and it can be said that the same serves a function similar to that of second p-type nitride semiconductor layer 209. If only undoped Al$_{0.17}$Ga$_{0.83}$N layer 218 is formed and second p-type nitride semiconductor layer 209 prepared substantially in an undoped state is eliminated, the Mg diffusion preventing function lowers. If the thickness of undoped Al$_{0.17}$Ga$_{0.83}$N layer 218 is not set to 2 nm but further increased in order to compensate for this, the driving voltage for the element rises although the Mg diffusion preventing effect rises. Therefore, it is important to keep the thickness of undoped Al$_{0.17}$Ga$_{0.83}$N layer 218 to the minimum thickness. On that account, the Mg diffusion prevention and suppression of driving voltage rising can be compatibly attained by combining the same with second p-type nitride semiconductor layer 209 prepared in the undoped state in practice.

Figure 6:
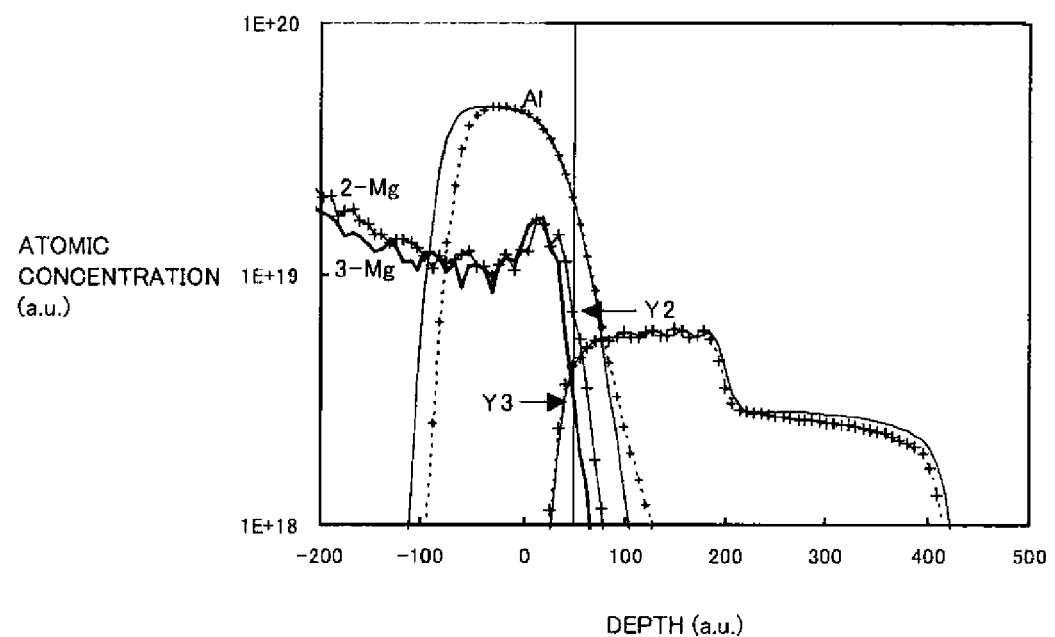
FIG. 6 is a diagram showing atomic concentration profiles of the nitride semiconductor light-emitting diode element according to Example 4 and a nitride semiconductor light-emitting diode element prepared by a production method similar to that in Example 1.

FIG. 6 shows atomic concentration profiles of the nitride semiconductor light-emitting diode element (hereinafter referred to as "element according to Example 4") according to Example 4 and a nitride semiconductor light-emitting diode element (hereinafter referred to as "element according to Example 1") prepared by a production method similar to that in Example 1 by SIMS. The axis of abscissas in FIG. 6 shows depths (depth (a.u.)), and the axis of ordinates shows atomic concentrations (concentration (a.u.)). Referring to FIG. 6, 2-Mg denotes the Mg atomic concentration in the element according to Example 1, 3-Mg denotes the Mg atomic concentration in the element according to Example 4, Al denotes relative Al atomic concentrations (substantially coinciding in the element according to Example 4 and the element according to Example 1), and In denotes relative In atomic concentrations (substantially coinciding in the element according to Example 4 and the element according to Example 1).

A vertical line is drawn on a portion corresponding to the uppermost layers of the quantum well layers of six cycles in FIG. 6, and it is assumed that Y2 and Y3 represent the Mg atomic concentration in the element according to Example 1 and the Mg concentration in the element according to Example 4 on the portion respectively. Comparing the Mg atomic concentration of Y2 and the Mg atomic concentration of Y3 with each other, the Mg atomic concentration of Y3 reaches $3\times10^{18}$ atoms/cm$^3$ while the Mg atomic concentration of Y2 is $7\times10^{18}$ atoms/cm$^3$, and it has been confirmed that Mg diffusion can be further suppressed.

The driving voltage for the element according to Example 4 was 2.9 V with operating current of 30 mA similar to that for the element according to Example 1. As to an emission output of the element according to Example 4, 45 mW was obtained with operating current of 30 mA.

When an electrostatic discharge threshold test of −1500 V was conducted in an HBM model as to the element according to Example 4, only 2% was electrostatically broken in the electrostatic discharge threshold test on 30000 samples, and it has been understood that the electrostatic discharge threshold is also excellent.

The embodiment and Examples disclosed this time must be considered as illustrative in all points and not restrictive. The range of the present invention is shown not by the above description but by the scope of claims for patent, and it is intended that all modifications within the meaning and range equivalent to the scope of claims for patent are included.

The present invention can be utilized for a nitride semiconductor light-emitting element and a method for producing a nitride semiconductor light-emitting element.

The invention claimed is:

1. A nitride semiconductor light-emitting element comprising:
   an n-type nitride semiconductor layer;
   a nitride semiconductor active layer provided on said n-type nitride semiconductor layer; and
   a p-type nitride semiconductor layer provided on said nitride semiconductor active layer, wherein
   said p-type nitride semiconductor layer includes a first p-type nitride semiconductor layer, a second p-type nitride semiconductor layer and a third p-type nitride semiconductor layer in this order from the side of said nitride semiconductor active layer,
   said first p-type nitride semiconductor layer- and said second p-type nitride semiconductor layer contain Al respectively,
   an average Al composition in said first p-type nitride semiconductor layer and an average Al composition in said second p-type nitride semiconductor layer are equivalent to each other,
   said third p-type nitride semiconductor layer has a smaller band gap than said second p-type nitride semiconductor layer, and
   the p-type impurity concentration in said second p-type nitride semiconductor layer and the p-type impurity concentration in said third p-type nitride semiconductor layer are lower than the p-type impurity concentration in said first p-type nitride semiconductor layer respectively.

2. The nitride semiconductor light-emitting element according to claim 1, wherein
   said p-type nitride semiconductor layer further includes a fourth p-type nitride semiconductor layer on a side of said third p-type nitride semiconductor layer opposite to the side where said nitride semiconductor active layer is set,
   said fourth p-type nitride semiconductor layer has a smaller band gap than said second p-type nitride semiconductor layer, and
   the p-type impurity concentration in said fourth p-type nitride semiconductor layer is higher than the p-type impurity concentration in said third p-type nitride semiconductor layer.

3. The nitride semiconductor light-emitting element according to claim 1, wherein
   said nitride semiconductor active layer has a multiple quantum well structure including a plurality of nitride semiconductor quantum well layers and a plurality of nitride semiconductor barrier layers, and
   a nitride semiconductor barrier layer, included in said plurality of nitride semiconductor barrier layers, other than a nitride semiconductor barrier layer in contact with said p-type nitride semiconductor layer contains an n-type impurity.

4. The nitride semiconductor light-emitting element according to claim 1, wherein
   said n-type nitride semiconductor layer includes an n-type nitride semiconductor contact layer and an n-type nitride semiconductor superlattice layer,
   said n-type nitride semiconductor superlattice layer is positioned between said n-type nitride semiconductor contact layer and said nitride semiconductor active layer, and
   an average n-type impurity concentration in said n-type nitride semiconductor superlattice layer is at least $1\times10^{18}$ atoms/cm$^3$.

5. A method for producing a nitride semiconductor light-emitting element, comprising the steps of:
   vapor-phase-growing a nitride semiconductor active layer on an n-type nitride semiconductor layer;
   vapor-phase-growing a first p-type nitride semiconductor layer containing Al on said nitride semiconductor active layer;
   vapor-phase-growing a second p-type nitride semiconductor layer, containing Al, having an equivalent average Al composition to said first p-type nitride semiconductor layer on said first p-type nitride semiconductor layer; and
   vapor-phase-growing a third p-type nitride semiconductor layer having a smaller average Al composition than said first p-type nitride semiconductor layer on said second p-type nitride semiconductor layer, wherein
   said second p-type nitride semiconductor layer and said third p-type nitride semiconductor layer are doped with a p-type impurity in lower concentrations than said first p-type nitride semiconductor layer respectively.

6. The method for producing a nitride semiconductor light-emitting element according to claim 5, wherein
   the vapor phase growth is interrupted after the step of vapor-phase-growing said second p-type nitride semiconductor layer and before the step of vapor-phase-growing said third p-type nitride semiconductor layer.

7. The method for producing a nitride semiconductor light-emitting element according to claim 6, wherein
   the pressure of the vapor phase is changed in the interruption of said vapor phase growth.

8. The method for producing a nitride semiconductor light-emitting element according to claim 5, further comprising a step of vapor-phase-growing a fourth nitride semiconductor layer doped with the p-type impurity in a higher concentration than said third p-type nitride semiconductor layer on said third p-type nitride semiconductor layer after the step of vapor-phase-growing said third p-type nitride semiconductor layer.

9. The nitride semiconductor light-emitting element according to claim 1, further comprising a nitride semiconductor layer containing Al between said nitride semiconductor active layer and said first p-type nitride semiconductor layer.

* * * * *